(12) United States Patent
Teklemariam et al.

(10) Patent No.: US 9,222,998 B2
(45) Date of Patent: Dec. 29, 2015

(54) COMPACT INHOMOGENEOUS PERMANENT MAGNETIC FIELD GENERATOR FOR MAGNETIC RESONANCE IMAGING

(76) Inventors: Grum Teklemariam, Washington, DC (US); Jianyu Lian, Westford, MA (US); David Cory, Needham, MA (US)

( * ) Notice: Subject to any disclaimer, the term of this patent is extended or adjusted under 35 U.S.C. 154(b) by 1138 days.

(21) Appl. No.: 13/139,377

(22) PCT Filed: Dec. 12, 2009

(86) PCT No.: PCT/US2009/067794
§ 371 (c)(1),
(2), (4) Date: Jun. 13, 2011

(87) PCT Pub. No.: WO2010/080350
PCT Pub. Date: Jul. 15, 2010

(65) Prior Publication Data
US 2011/0248715 A1    Oct. 13, 2011

(51) Int. Cl.
*G01R 33/383*  (2006.01)
*G01R 33/3873* (2006.01)
*G01R 33/38*   (2006.01)
G01R 33/563    (2006.01)

(52) U.S. Cl.
CPC .......... *G01R 33/3806* (2013.01); *G01R 33/383* (2013.01); *G01R 33/3808* (2013.01); *G01R 33/3873* (2013.01); *G01R 33/56341* (2013.01)

(58) Field of Classification Search
USPC .......................... 324/300–322; 600/407–435; 382/128–131; 335/296–306
See application file for complete search history.

(56) References Cited

U.S. PATENT DOCUMENTS

| | | | | |
|---|---|---|---|---|
| 5,490,509 | A  * | 2/1996  | Carlson et al. ............... | 600/410 |
| 5,739,688 | A    | 4/1998  | Krieg | |
| 6,147,578 | A  * | 11/2000 | Panfil et al. .................. | 335/296 |
| 6,191,584 | B1 * | 2/2001  | Trequattrini et al. ......... | 324/319 |
| 6,259,252 | B1 * | 7/2001  | Laskaris et al. ............... | 324/319 |
| 6,265,959 | B1 * | 7/2001  | Abele et al. ................... | 335/299 |
| 6,538,545 | B2 * | 3/2003  | Wakuda et al. ............... | 335/296 |
| 6,570,383 | B1   | 5/2003  | McKinnon et al. | |
| 6,842,002 | B2 * | 1/2005  | Cheng et al. .................. | 324/318 |
| 7,071,694 | B1 * | 7/2006  | Kruip ............................ | 324/323 |
| 7,323,875 | B2 * | 1/2008  | Ni et al. ........................ | 324/320 |
| 8,077,002 | B2 * | 12/2011 | Lian et al. ..................... | 335/306 |
| 2003/0001575 | A1 * | 1/2003 | Cheng et al. .................. | 324/318 |
| 2003/0011455 | A1 * | 1/2003 | Wakuda et al. ............... | 335/299 |
| 2006/0244451 | A1 * | 11/2006 | Ni et al. ........................ | 324/320 |
| 2006/0267715 | A1 * | 11/2006 | Ni et al. ........................ | 335/297 |
| 2007/0069731 | A1 * | 3/2007 | Ni et al. ........................ | 324/320 |
| 2007/0257758 | A1 * | 11/2007 | Chen et al. .................... | 335/287 |

(Continued)

FOREIGN PATENT DOCUMENTS

WO    WO 2007-094844    8/2007
WO    WO 2008-024092    2/2008

*Primary Examiner* — Melissa Koval
*Assistant Examiner* — Tiffany Fetzner
(74) *Attorney, Agent, or Firm* — Bay State IP, LLC (57) ABSTRACT

A magnet assembly primarily for use in MRI applications is disclosed. The magnet assembly is composed of a single disk and ring permanent magnet set connected to a C-type magnet yoke and return fixture with asymmetrically arranged poles. Together, the permanent magnets create a strong magnetic field that has a large static gradient in the central enclosure. The magnet assembly is primarily designed for diffusion based MRI scanning but can perform routine MRI scanning as well.

15 Claims, 9 Drawing Sheets

(56) References Cited

U.S. PATENT DOCUMENTS

2009/0085700 A1* 4/2009 Lian et al. .................... 335/302
2009/0179720 A1* 7/2009 Ni et al. ....................... 335/302
2011/0248715 A1* 10/2011 Telemariam et al. ......... 324/319
2012/0289821 A1* 11/2012 Graumann et al. ........... 600/424
2013/0207657 A1* 8/2013 Leskowitz et al. ............ 324/322

* cited by examiner

COMPACT INHOMOGENEOUS PERMANENT MAGNETIC FIELD GENERATOR FOR MAGNETIC RESONANCE IMAGING

CROSS REFERENCE TO RELATED APPLICATION

This application is for entry into the U.S. National Phase under §371 for International Application No. PCT/US2009/067794 having an international filing date of Dec. 12, 2009, and from which priority is claimed under all applicable sections of Title 35 of the United States Code including, but not limited to, Sections 120, 363 and 365(c), and which in turn claims priority under 35 USC 119 to U.S. Patent Application No. 61/138,940 filed on Dec. 18, 2008.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION

1. Field of the Invention

The invention relates to permanent magnet designs that can generate very strong and inhomogeneous fields primarily for NMR, MRI and MRT use.

2. Description of the Related Art

In Magnetic Resonance Imaging (MRI) there is a need for compact, very efficient and robust imaging systems that can perform high quality neurological MRI studies. Specifically, it is desirable for these systems to be capable of diffusion, angiography and functional imaging studies. MRI scanners typically work by manipulating hydrogen nuclei of patients inside a large, static and homogeneous magnet with radio frequency fields under the application of various encoding pulsed gradient magnetic fields. Today there is a need to add diffusion based MRI studies to quantify the development of stroke and to point to appropriate treatment planning. The use of strong gradients yields more informative diffusion weighted images. However, large switched gradient fields are practically difficult and there are physiological limits to the rate of change of magnetic fields.

Consequently, there is a dire need for high strength magnetic field gradients without requiring gradient switching. These new systems will enable improved diffusion imaging (essential for stroke studies), sharper angiography studies and potentially less noisy functional MRI studies. The invention will have strong, static gradients and thus yield more informative diffusion weighted images. Additionally, by taking advantage of a large static gradient in the main magnetic field the device will be compact and easier to site thereby enabling widespread use.

BRIEF SUMMARY OF THE INVENTION

The following summary is included only to introduce some concepts discussed in the Detailed Description below. This summary is not comprehensive and is not intended to delineate the scope of protectable subject matter, which is set forth by the claims presented.

Based on the above considerations, it is an object of embodiments of the present invention to provide a magnet system with a large static gradient that is primarily suitable for neurological studies by MRI and is very compact, lightweight and easy to site.

An objective of embodiments of this invention is to provide a magnet system that is composed of permanent magnets made up of two major sections: a disk portion and a ring portion that together generate a very strong magnetic field. The magnetization directions in the disk portion are axially oriented while in the ring portions they are substantially radially oriented.

Accordingly, such an arrangement of permanent magnet arrays has the effect of concentrating the flux generated in the center while minimizing the flux externally. A C-type magnet system and return fixture further concentrates the flux in the center and minimizes leakage while also being used to support the permanent magnets.

Another objective of embodiments of the invention is to provide the ability to generate a large static gradient. This is achieved by eliminating altogether the symmetric bottom half of the PM blocks.

A further means of controlling the magnetic field in the center is provided by poles asymmetrically arranged top and bottom to form a constant potential surface and there between generate a linear static gradient magnetic field. The pole system's effectiveness is enhanced by the drastically reduced flux generated in it due to the combination of the disk and ring portions of the PM blocks.

As a consequence of the reduced fluxes the yokes and returns have reduced volumes throughout and particularly are much lower in volume on the side of the magnet system that doesn't have the PM blocks.

It is another object of embodiment of the invention to provide a magnet assembly for use in MRI applications having a pair of poles oriented about a plane of symmetry parallel to each there between defining an air gap region, a magnet as a magnetic field source secured on a surface of one pole opposite the air gap, the magnet connected to a yoke on the surfaces opposite the pole, another yoke symmetrically disposed on the other side of the air gap with the other pole attached to it on the side facing the air gap and the pair of yokes connected to each other by returns so that the entire magnet assembly can form a closed magnetic flux circuit to substantially confine the magnetic fields in the air gap, poles, magnets, yokes and returns whereby the air gap, being cylindrical in geometry, forms an imaging region to place subjects for the purposes of examination.

Other aspects of the invention will become clear from the drawings and detailed description to follow.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

An inhomogeneous permanent magnetic field generator assembly will now be described in detail with reference to the accompanying drawings. It will be appreciated that, while the following description focuses on an assembly that generates magnetic fields for magnetic resonance imaging, the systems and methods disclosed herein have wide applicability. Notwithstanding the specific example embodiments set forth below, all such variations and modifications that would be envisioned by one of ordinary skill in the art are intended to fall within the scope of this disclosure.

The following design for an efficient compact MRI allows the magnet to shrink in size while trading off field inhomogeneity for increased field strength. With this advance, use can be made of compact magnets that have significant inhomogenieties. This permits the magnets to be lighter weight and have a smaller footprint.

Advances from fields such as quantum information processing have also led to Optimal control methods' that can precisely manipulate for example, hydrogen nuclei inside an MRI device with an inhomogeneous static field if this field distribution is well known. Embodiments of this invention are intended for use with these kinds of precise control methodologies.

Current state-of-the-art technologies enable reducing the size and weight of open whole-body permanent magnet (PM) based MRI magnets by as much as 70%. See US Patent Publication No. US20090085700 of Lian, et. al, the entire contents of which are herein incorporated by reference in their entirety. For example, here is a comparison of current systems designed as open PM magnets using conventional and new efficient approaches: 0.3 T 0.45 T 0.7 T Conventional designs: 15 Tons 20 Tons 30 Tons New efficient designs: 5 Tons 12 Tons 22 Tons In addition to these efficiencies, the requirement of a large static gradient allows the altogether elimination of one side of the PM blocks of the typically required two, one on the upper and the other on the lower side. Therefore, the proposed magnet assembly is composed of a single disk and ring permanent magnet set connected to a horizontal yoke on an upper magnet assembly and a horizontal yoke on a lower magnet assembly and a return fixture defining a C-type magnet with asymmetrically arranged poles. Together, the permanent magnets create a strong magnetic field that has a large static gradient in the central enclosure. This new configuration is extremely lightweight and compact in size.

The challenge of making a very efficient permanent magnet (PM) system can be met by using some recent advances and taking advantage of a large static gradient. Conventional, open PM systems use two disk-like PM blocks, one in the bottom and the other in the top to create a dipolar field in the air gap between them. Typical designs based on this approach can create central fields of up to 0.5 T for whole-body imaging. Although this is a very successful configuration when the need arises to go to higher magnetic fields there are many difficulties that arise. Many of the other support structures such as the horizontal yokes of the upper and lower magnet assembly connected by the return post start to saturate or need to be made larger to sustain the added fields and consequently make the system unwieldy in size and weight. Moreover, the very important poles also saturate rendering them ineffective in providing a constant potential surface so that the fields in the air gap are homogeneous and stable against center frequency drifts induced by temperature variations.

Figure 1:
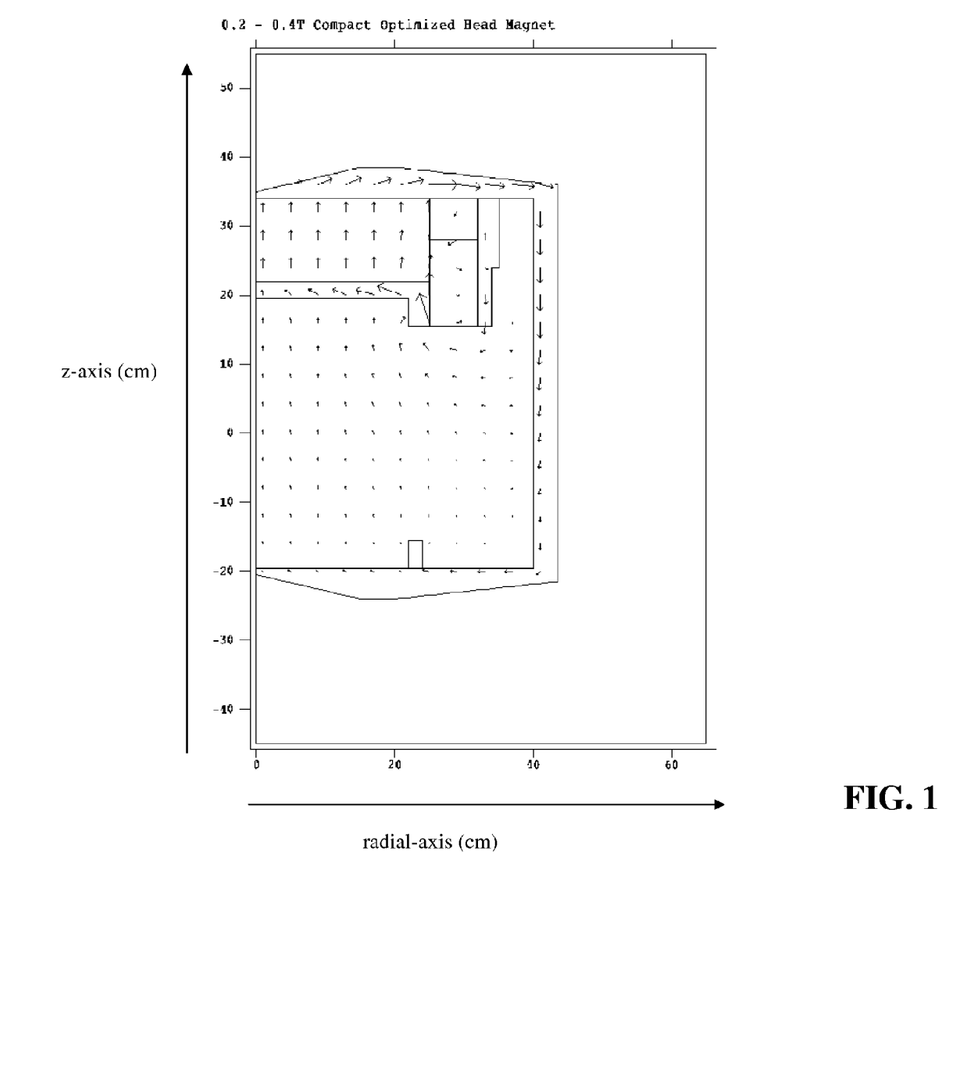
FIG. 1 shows a 2-dimensional (2D) finite-difference, axisymmetric model of the magnet and major magnetic field flux contours of one embodiment of the current invention. The z-axis is the axisymmetry axis.
Figure 2:
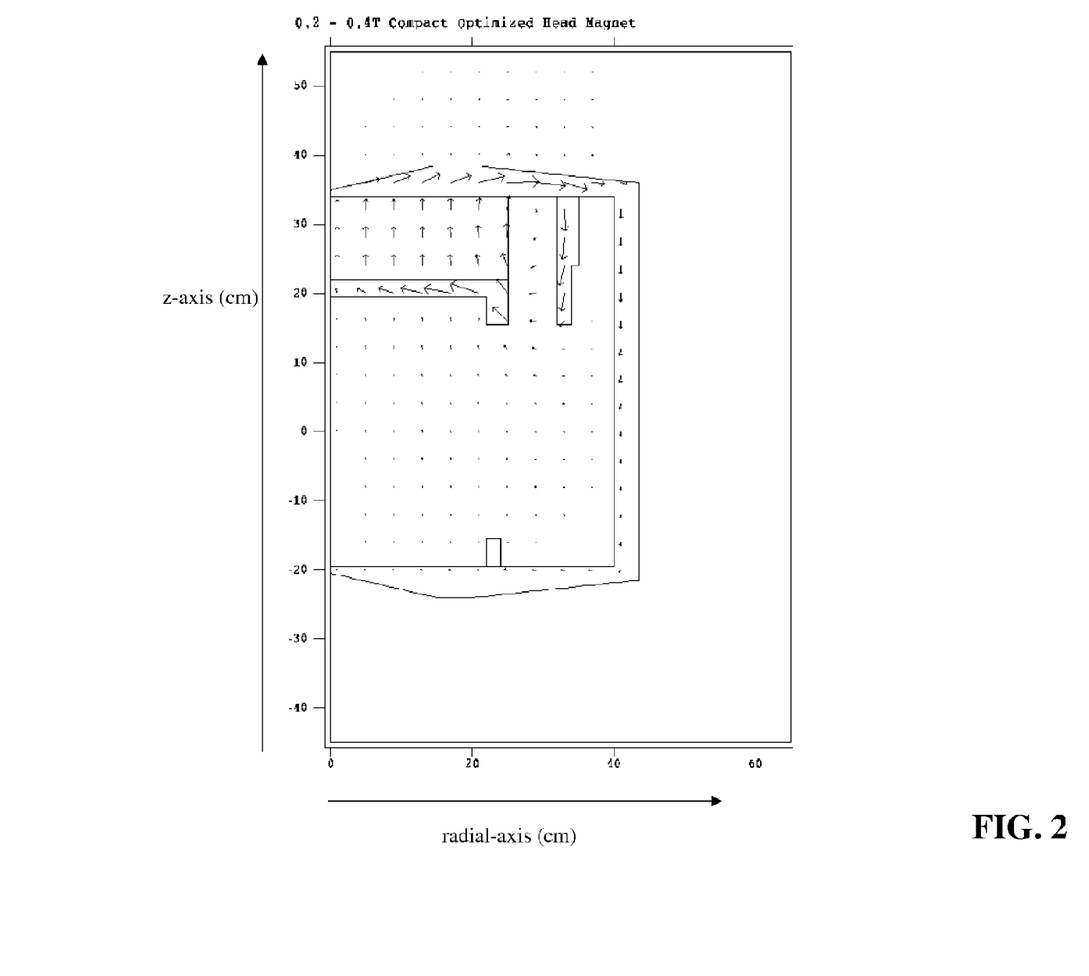
FIG. 2 shows a 2D finite-difference, axisymmetric model of the magnet and major magnetic field flux contours of one embodiment of the current invention with ONLY the disk portion of the PM blocks. The fluxes have a clockwise flow throughout the magnet. The z-axis is the axisymmetry axis.
Figure 3:
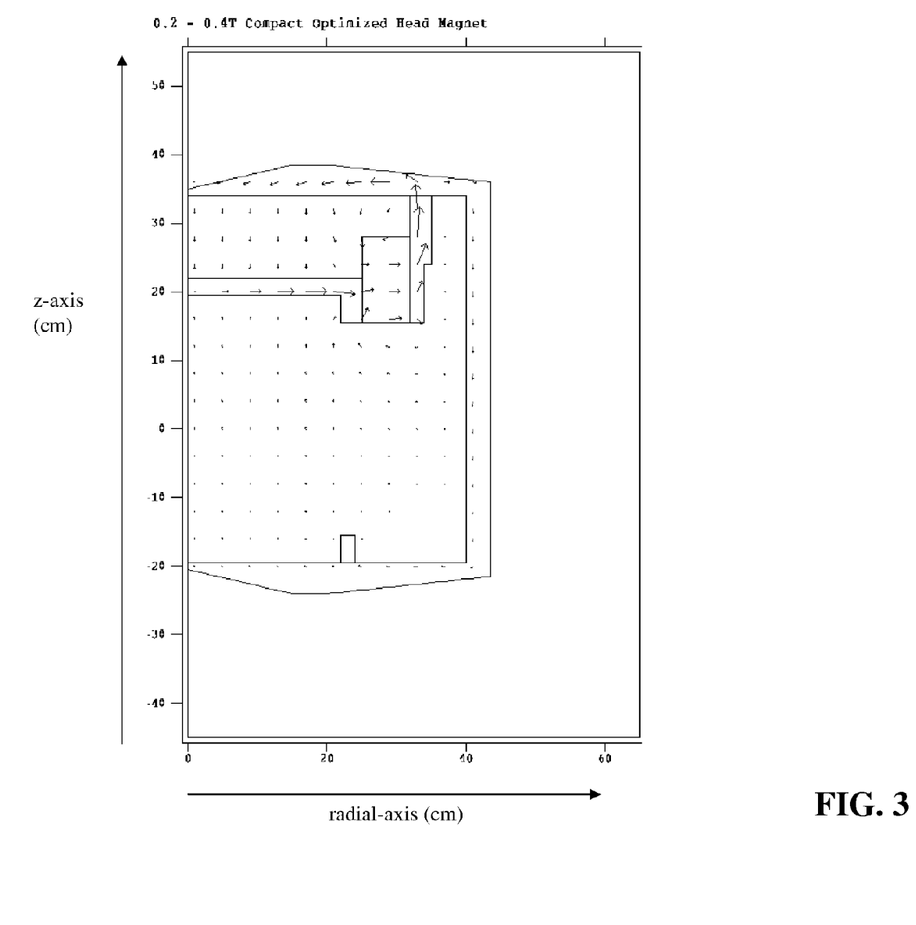
FIG. 3 shows a 2D finite-difference, axisymmetric model of the magnet and major magnetic field flux contours of one embodiment of the current invention with ONLY the ring portion of the PM blocks. The fluxes have a counterclockwise flow in the upper yoke part while they are still vertically directed in the air gap portion adding to the fields generated in the air gap by the disk PM blocks alone in FIG. 2. The z-axis is the axisymmetry axis.

Recent advances in PM based open MRI magnet designs (Lian, et. al.) address these problems by providing an additional field source strategically placed in the system. The idea is similar to taking advantage of natural efficiencies that arise in magnet systems based on Halbach-array type geometries. In addition to the conventional disk part of the PM blocks we add a ring PM as shown in the upper part of FIG. 1. The magnetization orientations in the upper disk-like portion of the PM blocks are vertical or axial while in the ring-like outer portions the magnetization orientations are radially out. This placement of the ring-like portion works as shown in FIGS. 2 & 3 where the disk part creates clockwise fluxes in the yokes and poles (FIG. 2) and the ring portion (FIG. 3) creates counter clockwise fluxes in the horizontal yokes and poles yet a vertically oriented field in the air gap as desired. Therefore, the poles and yokes, although the central field has been almost doubled, have significantly reduced fluxes flowing through them. Taking advantage of these kinds of efficiencies allows a dramatic reduction in the overall size and weight of open PM based MRI magnets.

A second equally significant effect that further reduces the size and weight of the system is a large static gradient in the central magnet field between the air gap. A very natural way to create this is to eliminate the lower PM blocks altogether. FIGS. 1, 2 & 3 already depict 2D field plots of an axisymmetric finite-difference model with the lower PM sections eliminated.

Figure 4:
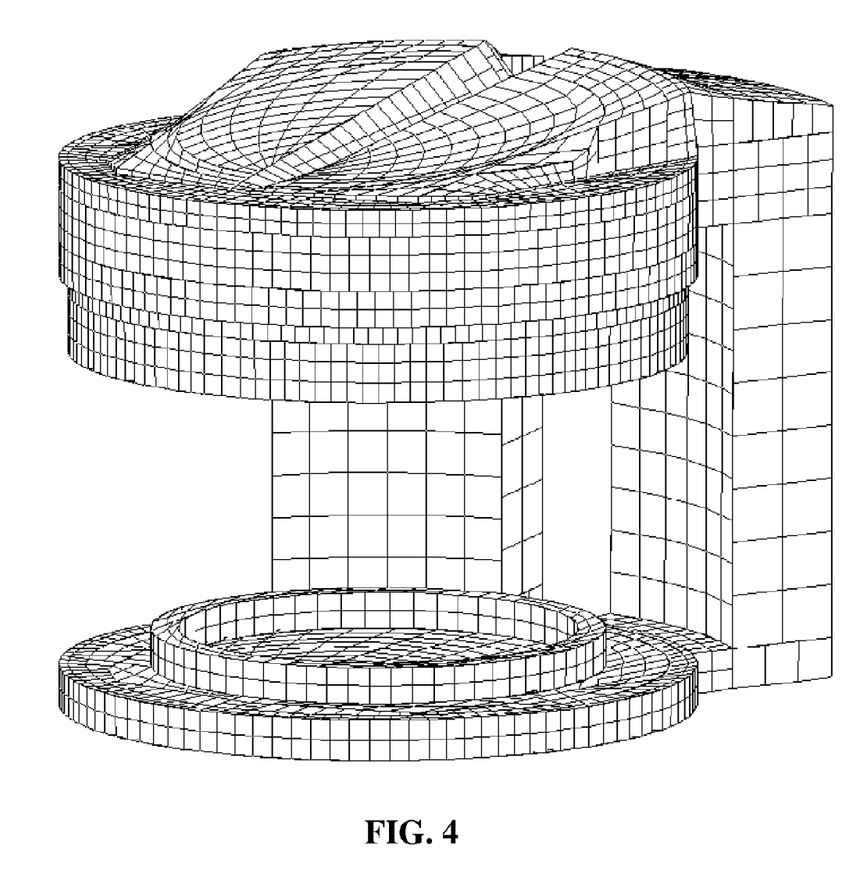
FIG. 4 shows a 3D boundary element model of one embodiment of the current invention.
Figure 6:
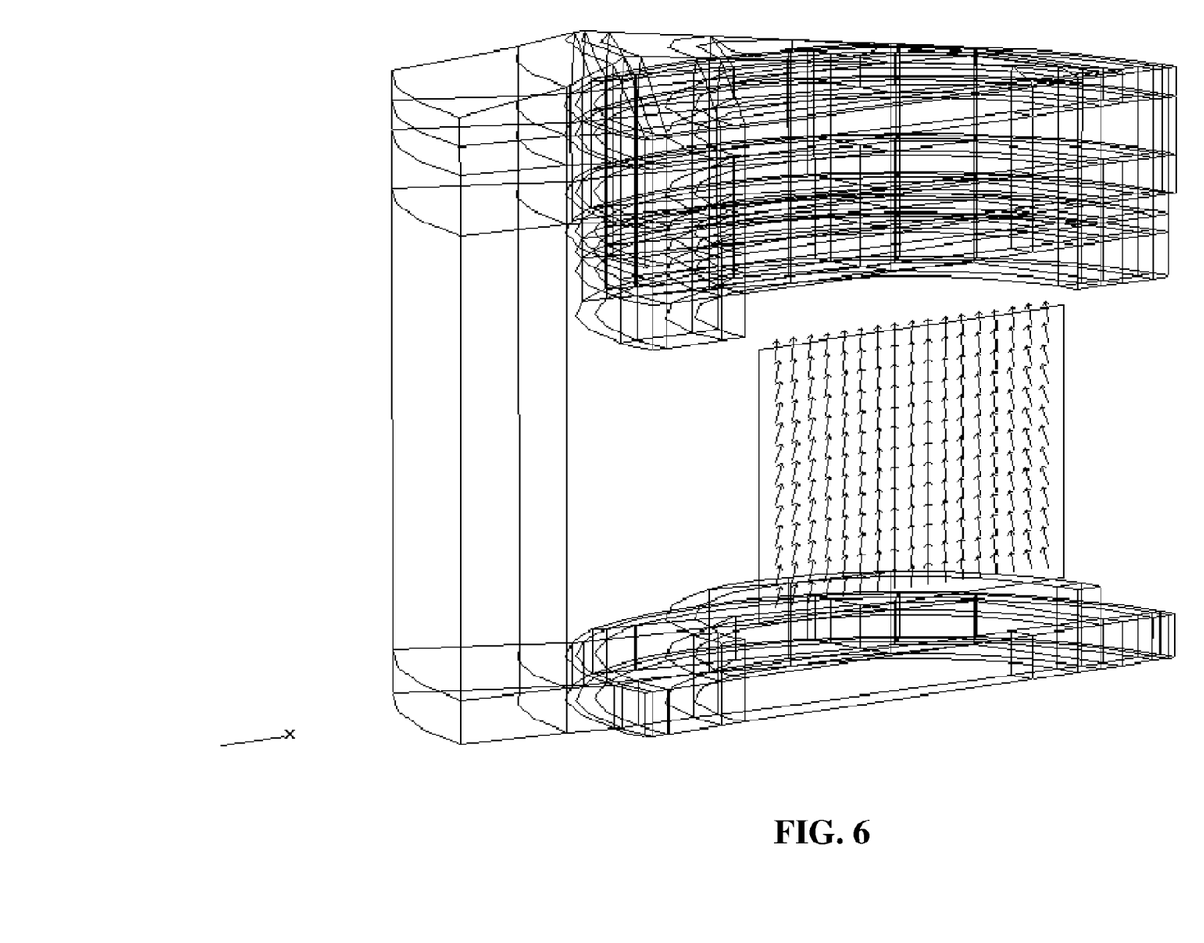
FIG. 6 shows one half of the 3D boundary element model of one embodiment of the current invention showing the vector magnetic field profiles in the central imaging plane.
Figure 7:
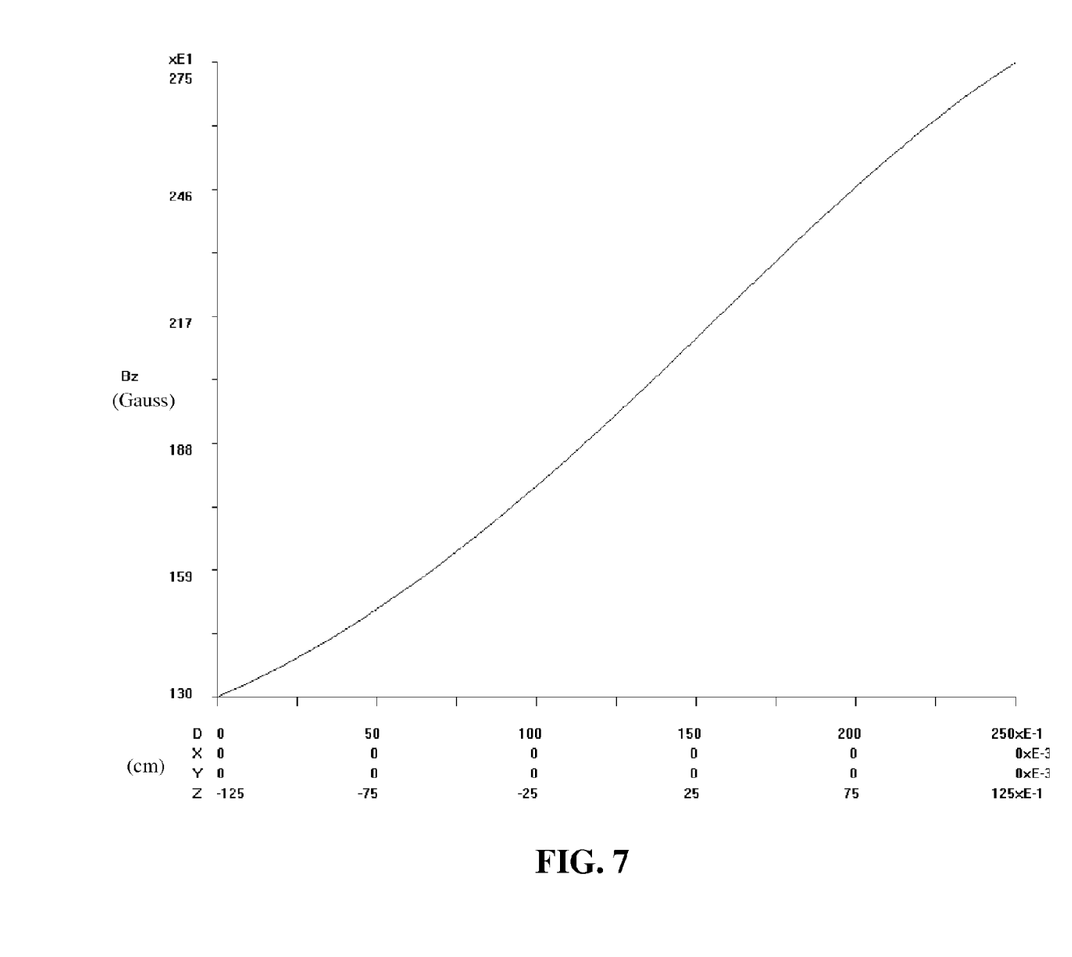
FIG. 7 shows a plot of the 3D boundary element model of one embodiment of the current invention along the central vertical axis showing a linear field variation of about 60 G/cm over a span of 25 cms.
Figure 8:
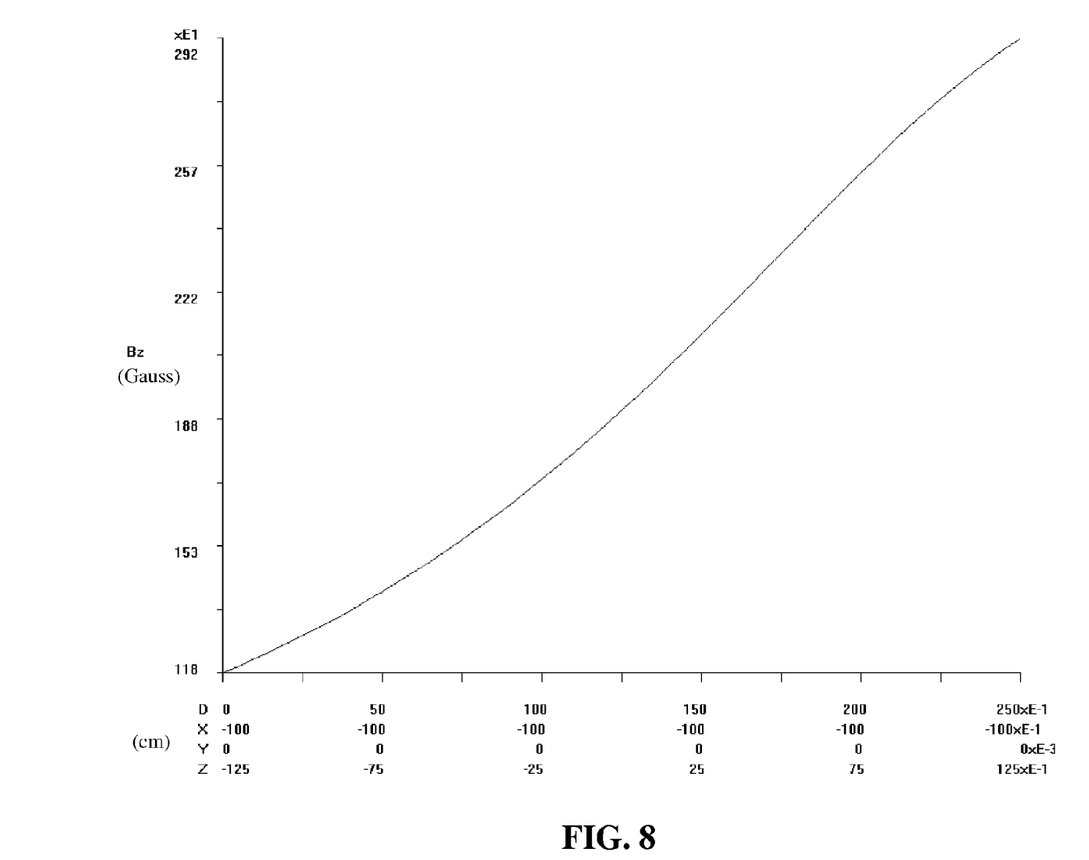
FIG. 8 shows a similar plot to FIG. 7 with the x-axis position offset by −10 cm again showing a 60 G/cm linear variation along the central vertical axis over a span of 25 cms.
Figure 9:
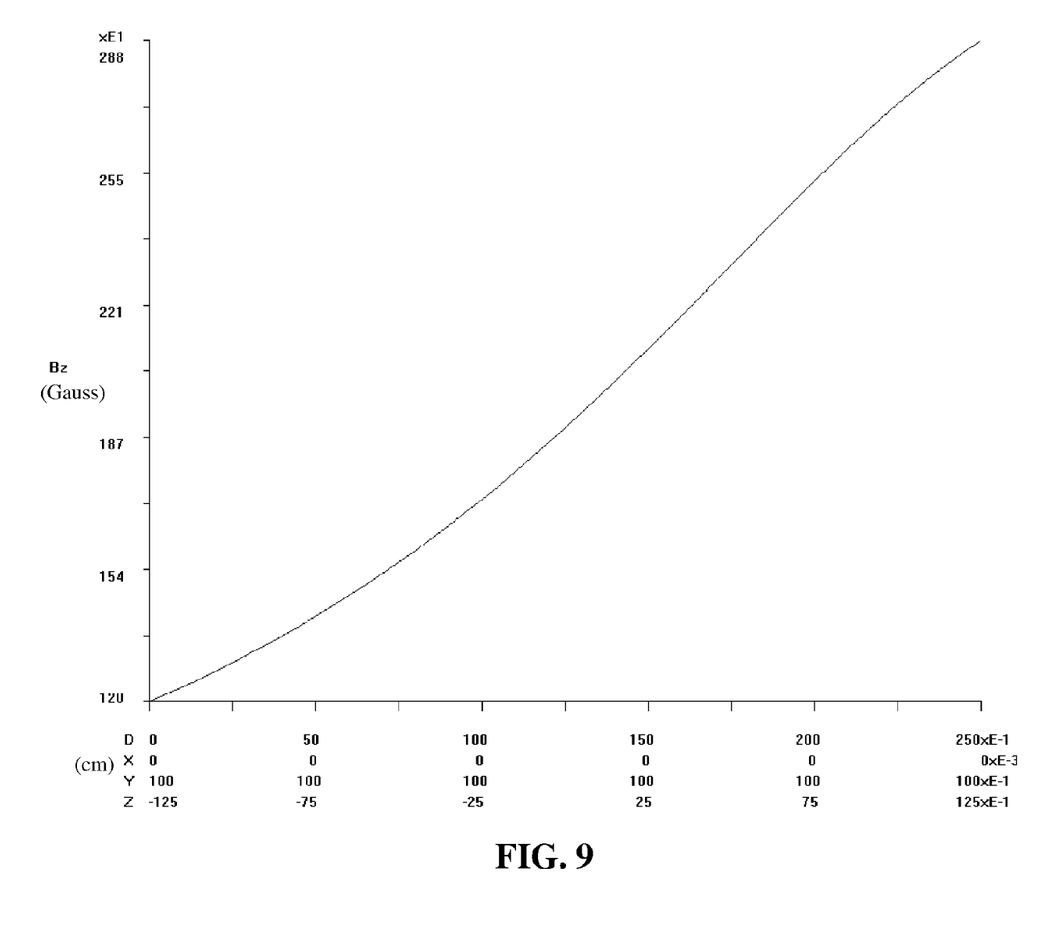
FIG. 9 shows a similar plot to FIG. 7 with the y-axis position offset by +10 cm once again showing a 60 G/cm linear variation along the central vertical axis over a span of 25 cms.

Exploiting all these features a 3D magnet design is shown in FIG. 4. This system has a footprint of about a 90 cm diameter and weighs around 0.8 metric tons. It has a static gradient of about 60 G/cm as shown in FIGS. 7-9 of the Bz component field distribution over a 25 cm region vertically and 20 cm region laterally. The PM magnet blocks have an energy density of about 47 MGOe. FIG. 6 shows what the vector plot over that central plane looks like.

The specific design considered above can be improved by a detailed optimization that first considers increasing the energy density of the PM magnet blocks to about 52 MGOe. This material is the highest energy density PM material that is commercially available and considered viable as a product. Additionally, the horizontal yokes and return post that now compose about 60% of the overall weight can be significantly trimmed. However, this must be done without compromising structural integrity.

Figure 5:
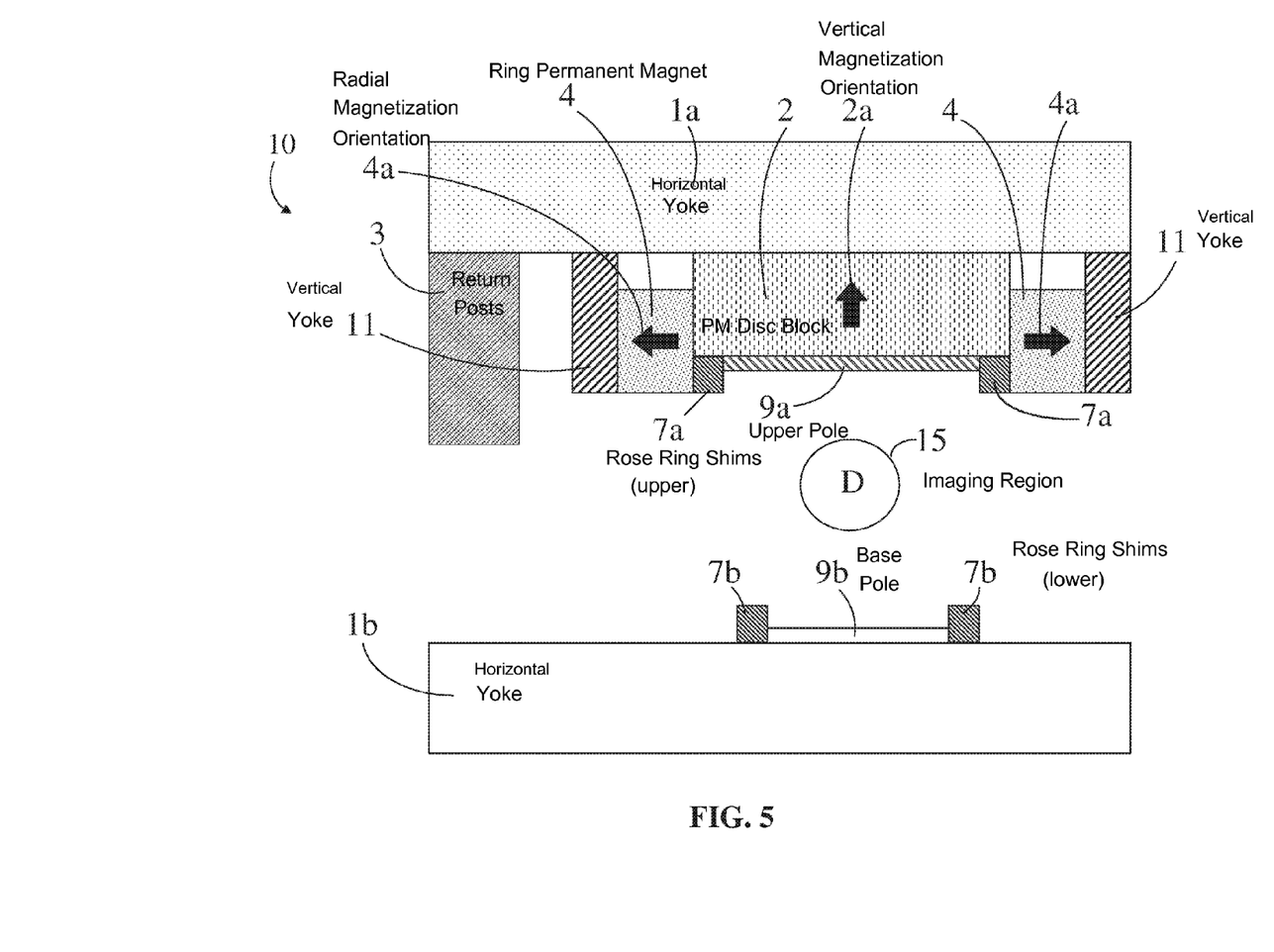
FIG. 5 shows a 3-dimensional (3D) detailed cross-sectional view of the magnet in one embodiment of this invention.

System 10, shown in FIG. 5, is a detailed cut-away view of the current invention. The system 10 includes an upper magnet assembly and a lower magnet assembly asymmetrically oriented above and below a plane of asymmetry parallel to each other thereby defining an air gap region 15. In this embodiment, the upper magnet assembly is located above the plane of asymmetry and consists only of a horizontal yoke 1a which is attached to a permanent magnet disk block 2 with vertical magnetization orientation 2a as depicted in the pictorial. Ring permanent magnet 4 is attached around the permanent magnet disk block 2 with outward radial magnetization orientation 4a depicted in this pictorial. The permanent magnet disk block 2 and ring permanent magnet 4 have attached to them disk-like pole 9a and a set of upper ring rose shims 7a as shown in the pictorial. The ring permanent magnet 4 has attached to it a vertical yoke 11 that extends the whole axial length of the ring permanent magnet 4 and connects to the horizontal yoke 1a. The lower magnet assembly consists only of a horizontal yoke 1b and a bottom base pole 9b that has a different radius and thickness to upper pole 9a. As depicted here it is lower radius but it can be higher depending on the design parameters and the desired specific static linear gradient main magnetic field. A set of bottom ring rose shims 7b are attached to the bottom base pole and are also offset relative to the set of upper ring rose shims 7a and can have different height, thickness and overall dimension, again depending on the specific design goals for the main magnetic field. The upper magnet assembly and lower magnet assembly are magnetically connected by a return post 3 thereby defining a C-type magnet to form a high reluctance path closed magnetic circuit containing leakage flux and concentrating the magnetic field in the air gap forming an imaging region 15 with a useable volume of at least 25 cm DSV.

Altogether, this new magnet has substantial benefits over previous or conventional magnet designs by being very lightweight and easy to site for MRI applications when used with the appropriate hydrogen nuclei control methods to obtain the desired neurological images.

The drawings and descriptions while demonstrating the main objects of the invention, together with the claims below are in no way meant to limit the scope and spirit of the invention. Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention. Although this invention has been described in the above forms with a certain degree of particularity, it is understood that the present disclosure has been made only by way of example and numerous changes in the details of construction and combination and arrangement of parts may be resorted to without departing from the spirit and scope of the invention.

What is claimed is:

1. A magnet assembly configured for magnetic resonance imaging (MRI) applications comprising:
    an upper magnet assembly and a lower magnet assembly asymmetrically oriented above and below a plane of asymmetry parallel to each other thereby defining an air gap region;
    wherein the upper magnet assembly is located above the plane of asymmetry and consists only of:
        a permanent magnet disk block;
        a horizontal yoke connected to the permanent magnet disk block;
        a ring permanent magnet attached around the permanent magnet disk block;
        a disk-like pole attached to the permanent magnet disk block;
        a set of upper ring rose shims attached to the disk-like pole and the ring permanent magnet;
        a vertical yoke attached to the ring permanent magnet that extends along an entire axial length of the ring permanent magnet and connects to the horizontal yoke;
        wherein the permanent magnet disk block provides an upper magnetic field source;
    wherein the lower magnet assembly is located below the plane of asymmetry and consists only of:
        a horizontal yoke;
        a bottom base pole attached to the horizontal yoke; and
        a set of bottom ring rose shims attached to the bottom base pole;
    wherein the horizontal yoke of the upper magnet assembly and the horizontal yoke of the lower magnet assembly are oriented about a plane of asymmetry parallel to each other, opposite the air gap region;
    wherein the horizontal yoke of the upper magnet assembly and the horizontal yoke of the lower magnet assembly are connected to each other by a return defining a C-type magnet, so that the entire magnet assembly forms a closed magnetic flux circuit in order to confine the magnetic fields to the magnet assembly itself, with the air gap, being cylindrical in geometry, and forming an imaging region in which to place a subject that is undergoing an MRI examination.

2. The magnet assembly configured for use in the magnetic resonance imaging applications of claim 1, wherein each magnetic disk-like poles further comprises:
    a base section that is disk-like and is diametrically wide enough to generate magnetic fields in the air gap;
    wherein the base section material is made of a magnetically soft, high permeability material;
    each base section has a ring-like section protruding into the air gap;
    the ring-like section being made of a magnetically soft, high permeability material; and
    the ring-like section having a height that can vary in length from zero to a finite value as required by the specific magnet design.

3. The magnet assembly configured for use in the magnetic resonance imaging applications of claim 1, wherein each permanent magnet is comprised of a solid disk-like central portion section and an annular outer ring portion section;
    wherein the disk-like central section is magnetized in the axial direction;
    the annular outer ring section is magnetized substantially in the radial direction;
    the magnet having its disk-like central section main magnetization orientation pointed axially with North Pole pointing towards the horizontal yoke of the upper magnet assembly so that the annular outer ring portion relative to this orientation has its main magnetization orientation pointed radially out; and an opposite orientation of the permanent magnet when the permanent magnet has the North Pole of the magnetization in the disk portion pointing away from the horizontal yoke of the upper magnet assembly and the radial section magnetization points radially in.

4. The magnet assembly configured for use in the magnetic resonance imaging applications of claim 1, wherein the horizontal yokes of claim 1 further comprise:

a base yoke section and an annular ring section wherein, the horizontal yoke of the upper magnet assembly providing a support structure with respect to the permanent magnet and the magnetic disk-like poles on the side with the permanent magnet;

wherein, the base section is sufficiently massive in order to carry a magnetic field flux though it without leakage;

the annular ring section of the horizontal yoke of the upper magnet assembly is also sufficiently massive in order to carry the magnetic field flux from the annular ring sections of the magnet;

the ring section of the horizontal and vertical yokes of the upper magnet assembly being located adjacent to the ring portions of the permanent magnets thereby providing an efficient and even flux distribution throughout the magnetic assembly;

the ring section of the horizontal and vertical yokes of the upper magnet assembly containing all the magnetic flux within it without substantial leakage into surrounding magnetic circuit structures and air regions; and horizontal yoke of the bottom magnet assembly opposite the horizontal yoke of the upper magnet assembly supporting the whole magnet and providing support for the other magnetic disk-like pole opposite the air gap.

5. The magnet assembly configured for use in the magnetic resonance imaging applications of claim 1 wherein the use of only one magnet source on one side of the air gap creates a large static gradient.

6. The magnet assembly configured for use in the magnetic resonance imaging applications of claim 2 wherein the disk-like poles are diametrically asymmetric, with this asymmetry being able to be adjusted in order to achieve the requisite static gradient as a means of shimming.

7. The magnet assembly configured for use in the magnetic resonance imaging applications of claim 2, wherein the base section of the magnetic disk-like poles is polygonal in shape.

8. The magnet assembly configured for use in magnetic resonance imaging applications as in claim 7 wherein, the base section is made of a magnetically hard material.

9. magnet assembly configured for use in the magnetic resonance imaging applications of claim 7, wherein the ring section of the magnetic disk-like poles is comprised of a permanent magnet material.

10. The magnet assembly configured for use in the magnetic resonance imaging applications of claim 3, wherein the central disk-like sections of the permanent magnet are polygonal in shape.

11. The magnet assembly configured for use in the magnetic resonance imaging applications of claim 10, wherein the permanent magnet components further comprise central disk-like annular or polygonal sections having subsections that are axially magnetized, while exhibiting slightly different axial magnetization orientations relative to each other; and each of the central disk-like annular or polygonal ring sections also having subsections that are radially magnetized, while exhibiting slightly different radial magnetization orientations relative to each other.

12. The magnet assembly configured for use in the magnetic resonance imaging applications of claim 4, wherein the ring portion of the horizontal yokes improves a high reluctance path in surrounding regions exclusive of the magnet assembly, in particular, regions between the horizontal yoke of the upper magnet assembly and the permanent magnet sections thereby enabling the return to be placed closer into the air gap and/or even making contact with the ring portion of the horizontal yoke of the upper magnet assembly; and, the ring portion being tapered from the horizontal yoke of the upper magnet assembly towards the air-gap.

13. The magnet assembly configured for use in the magnetic resonance imaging applications of claim 12, wherein the ring portion of the horizontal yokes is a permanent magnet with magnetization oriented in the axial direction in order to extend a homogeneous region into the air gap and aid in shimming a central imaging region.

14. The magnet assembly configured for use in the magnetic resonance imaging applications of claim 3, wherein the permanent magnets comprise a ferromagnetic section in order to reduce mechanical forces during assembly while increasing a magnetic central field value produced by the solid disk-like central portion section of the permanent magnet and a magnetic saturation of the magnetic ring-like poles.

15. The magnet assembly configured for use in the magnetic resonance imaging applications of claim 10, wherein the annular outer ring portion sections of the permanent magnets are able to be mechanically moved so that the central field produced by the solid disk-like central portion section of the permanent magnet and the homogeneity of the permanent magnet are adjustable.

* * * * *